US010712296B2

(12) United States Patent
Vishnyakov et al.

(10) Patent No.: US 10,712,296 B2
(45) Date of Patent: Jul. 14, 2020

(54) HANDHELD MATERIAL ANALYSER

(71) Applicant: ORION ENGINEERING LIMITED, Nantwich, Cheshire (GB)

(72) Inventors: Vladimir Vishnyakov, Huddersfield (GB); Paul Nicholas Gater, Nantwich (GB)

(73) Assignee: ORION ENGINEERING LIMITED, Nantwich, Cheshire (GB)

( * ) Notice: Subject to any disclaimer, the term of this patent is extended or adjusted under 35 U.S.C. 154(b) by 0 days.

(21) Appl. No.: 16/471,199

(22) PCT Filed: Dec. 22, 2017

(86) PCT No.: PCT/GB2017/053875
§ 371 (c)(1),
(2) Date: Jun. 19, 2019

(87) PCT Pub. No.: WO2018/115898
PCT Pub. Date: Jun. 18, 2018

(65) Prior Publication Data
US 2020/0088660 A1     Mar. 19, 2020

(30) Foreign Application Priority Data
Dec. 23, 2016    (GB) .................................. 1622206.9

(51) Int. Cl.
*G01N 23/2252*     (2018.01)
*H01J 37/073*     (2006.01)
(Continued)

(52) U.S. Cl.
CPC ........ *G01N 23/2252* (2013.01); *H01J 37/073* (2013.01); *H01J 37/18* (2013.01);
(Continued)

(58) Field of Classification Search
USPC ........................................ 250/306, 307, 310
See application file for complete search history.

(56) References Cited

U.S. PATENT DOCUMENTS

| | | | |
|---|---|---|---|
| 4,590,376 A | 5/1986 | Smith | |
| 5,150,043 A | 9/1992 | Flesner | |

(Continued)

FOREIGN PATENT DOCUMENTS

| | | |
|---|---|---|
| CN | 103267909 B | 4/2015 |
| DE | 10046532 A1 | 7/2001 |

(Continued)

OTHER PUBLICATIONS

Henderson, et al., "Ultraviolet stimulated electron source for use with low energy plasma instrument calibration", Space Science and Applications, Los Alamos National Laboratory, Los Alamos, New Mexico, Jun. 15, 2012, 15 pages.

(Continued)

*Primary Examiner* — Kiet T Nguyen
(74) *Attorney, Agent, or Firm* — Dickinson Wright PLLC

(57) ABSTRACT

The present invention relates to a handheld material analyser comprising an air-tight chamber having an analysis aperture; an electron beam generation system adapted to direct a beam of electrons through the analysis aperture; an Energy-Dispersive X-ray (EDX) spectroscopy system having a detector located in the chamber; the chamber being adapted to operate at internal pressures between atmospheric pressure and a vacuum of the order of 1 Pa; and a gas inlet adapted to receive an inert gas for generating a plasma in the region of the photocathode. In this way, the plasma can clean the photocathode.

23 Claims, 6 Drawing Sheets

(51) Int. Cl.
*H01J 37/18* (2006.01)
*H01J 37/252* (2006.01)

(52) U.S. Cl.
CPC ..... *H01J 37/252* (2013.01); *H01J 2237/0225* (2013.01); *H01J 2237/06333* (2013.01); *H01J 2237/2442* (2013.01)

(56) References Cited

U.S. PATENT DOCUMENTS

| | | | |
|---|---|---|---|
| 5,578,821 | A | 11/1996 | Meisberger et al. |
| 6,765,202 | B1 | 7/2004 | Hohn |
| 8,774,359 | B1 | 7/2014 | Zhuang et al. |
| 9,679,741 | B2 * | 6/2017 | Novak ............... H01J 37/18 |
| 2002/0034325 | A1 | 3/2002 | Reinhorn et al. |
| 2005/0253069 | A1 * | 11/2005 | Zewail ............... H01J 37/065 250/311 |
| 2009/0045716 | A1 | 2/2009 | Han et al. |
| 2012/0027181 | A1 | 2/2012 | Takai et al. |
| 2013/0129054 | A1 | 5/2013 | Ishida |
| 2014/0037052 | A1 * | 2/2014 | Adler ............... G01N 23/044 378/43 |
| 2014/0044239 | A1 | 2/2014 | Gendreau et al. |
| 2014/0124662 | A1 | 5/2014 | Yang et al. |
| 2014/0339423 | A1 | 11/2014 | Kim et al. |
| 2014/0367568 | A1 | 12/2014 | Kim et al. |

FOREIGN PATENT DOCUMENTS

| | | |
|---|---|---|
| DE | 10007650 A1 | 9/2001 |
| DE | 102011005731 A1 | 9/2012 |
| EP | 2110844 A1 | 10/2009 |
| GB | 1367302 A | 9/1974 |
| JP | 041249 A | 1/1992 |
| JP | 10217508 A | 8/1998 |
| JP | 1199140 A | 4/1999 |
| JP | 2000074860 A | 3/2000 |
| JP | 2010135133 A | 6/2010 |
| RU | 2507627 C1 | 2/2014 |
| WO | 2008123301 A1 | 10/2008 |
| WO | 2011114832 A1 | 9/2011 |
| WO | 2012123217 A1 | 9/2012 |
| WO | 2013035823 A1 | 3/2013 |
| WO | 2014017544 A1 | 1/2014 |

OTHER PUBLICATIONS

International Search Report and Written Opinion for related International application No. PCT/GB2017/053875, dated Mar. 21, 2018, 12 pages.
International Preliminary Report on Patentability for related international application No. PCT/GB2017/053875, dated Jul. 4, 2019, 7 pages.
GB Search Report for related application GB1622206.9, dated May 2, 2017, 3 pages.

* cited by examiner

HANDHELD MATERIAL ANALYSER

This invention relates to a handheld material analyser, and a method for analysing a material sample using a handheld material analyser.

BACKGROUND

In the metal production and deployment industry, materials such as construction steel and other alloys, need to be analysed frequently for house-keeping and quality control purposes. For example, it may be desired to identify the material or to monitor whether the material composition conforms to the specification.

Additionally, there is a growing requirement for material identification of actual components of a shipped product, rather than relying on general supplied material certification.

Typically, samples such as shavings or pieces of the material to be analysed are sent to a laboratory for analysis. This is expensive in samples sent and is also time consuming, further increasing the cost of such analysis and creating delays in production.

BRIEF SUMMARY OF THE DISCLOSURE

Embodiments of the invention are sent forth in the appended claims.

In one of aspect of the invention there is provided a handheld material analyser comprising an air-tight chamber having an analysis aperture; an electron beam generation system adapted to direct a beam of electrons through the analysis aperture; an Energy-Dispersive X-ray (EDX) spectroscopy system having a detector adapted to detect the results of the electron beam impacting the material to be analysed; the chamber being adapted to operate at internal pressures between atmospheric pressure and a vacuum of the order of or below 1 Pa, and having an outlet adapted to be connected to a vacuum pump; and a gas inlet adapted to receive an inert gas suitable for generating a plasma in the region of the photocathode, such that the plasma cleans the photocathode.

The analysis aperture may be surrounded by a seal suitable for forming a temporary air-tight seal against a material surface to be analysed.

The electron beam generation system may comprise a focussed LED adapted to illuminate a photocathode, wherein the photocathode is located in the chamber.

Optionally the detector of the EDX system is located in the chamber.

The chamber may comprise a beam generation chamber separated from a sample chamber by a normally closed air-tight separation valve, which in an open position provides a path for the beam of electrons to reach the aperture. The outlet may be located in the sample chamber. The EDX detector may be located in the beam generation chamber.

The gas inlet may be located in the beam generation chamber. The gas inlet may be connected to a gas supply system. The handheld material analyser may comprise a calibrated leak washer for admitting gas to the chamber through the gas inlet.

Optionally, the outlet is connected to a single stage vacuum pump.

The outlet may be connected to a mobile vacuum indication and monitoring unit.

Optionally, the photocathode is aluminium.

The LED may have a wavelength of 300 nm.

The handheld material analyser may comprise a control module adapted to assess the efficacy of the electron beam generation system. The control module may be further adapted to trigger cleaning of the photocathode if the efficacy drops below a threshold.

The handheld material analyser may comprise a high voltage power supply connected to the photocathode. The efficacy of the electron beam generation system may be assessed by monitoring current drained therefrom.

The high voltage power supply may be adapted to provide a voltage to the photocathode of below or equal to 15 kV during electron beam generation. The high voltage power supply may be adapted to provide a voltage below or equal to 2 kV during cleaning.

The EDX spectroscopy system further may comprises a spectrometer for counting X-rays detected by the detector and the efficacy of the electron beam generation system is assessed by monitoring the number of detected x-rays per unit time.

The chamber may be adapted to operate at an internal pressure below 1 Pa.

In another aspect of the invention there is provided a method for analysing a material sample using a handheld material analyser, the handheld material analyser having a chamber with an analysis aperture, the steps of the method comprising applying the analysis aperture to a surface of a material to be analysed such that an air-tight seal is formed; establishing a pressure of the order of or below 1 Pa within the chamber; generating a beam of electrons from a photocathode and directing the beam of electrons at the surface through the analysis aperture; analysing X-ray emissions from the surface resulting from the impact of the beam of electrons to determine the elemental composition of the material sample; the method further comprising assessing the efficacy of the step of generating a beam of electrons, and if the efficacy is below a threshold, initiating a cleaning cycle, wherein the cleaning cycle comprises forming a plasma in the region of the photocathode.

The method may include generating a beam of electrons in the chamber. Preferably, generating the electron beam comprises illuminating a photocathode within the chamber with a focussed LED.

Forming a plasma may comprise adjusting the potential between the chamber and photocathode; and providing an inert gas to the chamber through a gas inlet to generate a pressure in the order of 10 Pa.

Optionally, the step of assessing the efficacy comprises measuring the current drain from a high voltage power supply powering the photocathode.

The step of assessing the efficacy may comprise counting characteristic X-rays emitted by the sample in response to the electron beam.

The step of adjusting the potential between the chamber and the photocathode may comprise setting the potential at around 2 kV.

Optionally, the cleaning cycle further comprises deactivating the focussed LED.

The chamber may comprises a beam generation chamber separated from a sample chamber by normally closed air-tight separation valve, which in an open position provides a path for the beam of electrons to reach the aperture, wherein the sample chamber comprises the outlet which is connected to a vacuum pump and the method may comprise the further steps of, after applying the analysis aperture to the surface, establishing a pressure in the order of 10 Pa within the sample chamber, then opening the separation valve, and establishing a pressure of the order of or below 1 Pa within the chamber.

Optionally, the vacuum pump is a fore-vacuum pump.

BRIEF DESCRIPTION OF THE DRAWINGS

Embodiments of the invention are further described hereinafter with reference to the accompanying drawings, in which.

DETAILED DESCRIPTION

Figure 1:
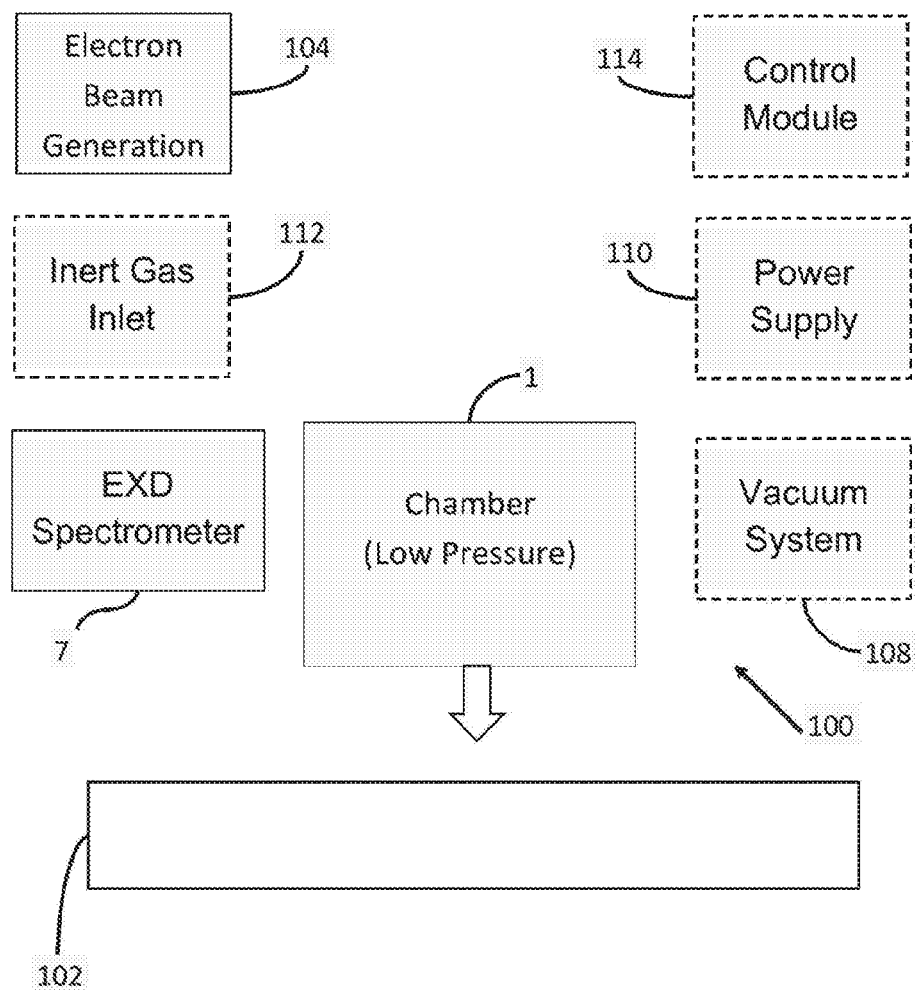
FIG. 1 is a block diagram of example material analyser.
Figure 2:
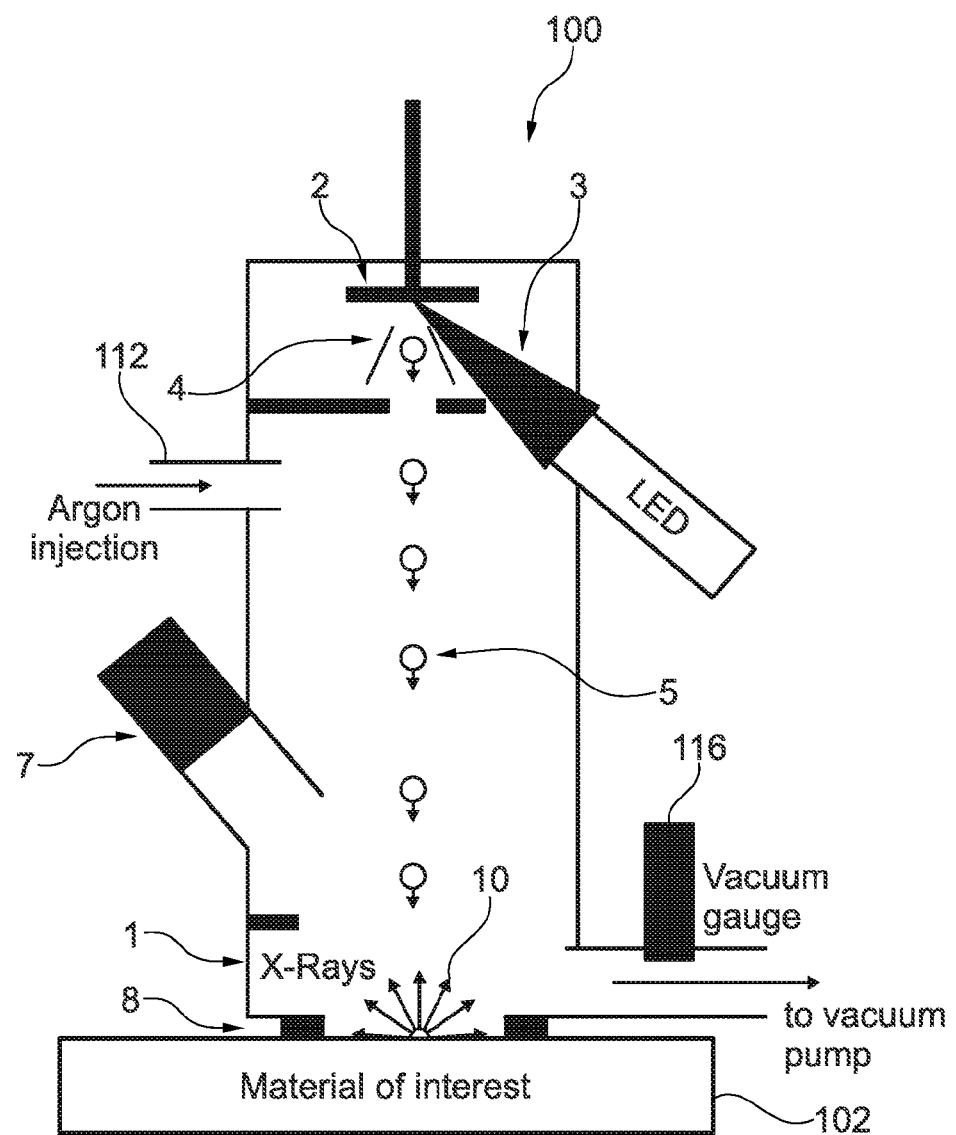
FIG. 2 is a diagram of example material analyser.

Referring to FIGS. 1 and 2, there is shown a handheld material analyser 100 directed at a sample 102 of a material to be analysed.

The handheld material analyser 100 comprises an air-tight chamber 1 adapted to operate at a low pressure, for example down to a pressure of 1 Pa or below. The chamber may be referred to as a vacuum chamber. The chamber may have a volume in the range 10-20 cm$^3$.

The handheld material analyser 100 comprises an electron beam generation system 104, which in turn comprises a photocathode 2, a focussed Light Emitting Diode (LED) 3, adapted to directed a beam of light at the photocathode 2, and electron beam lenses 4. The electron beam generation system 104 generates a beam of electrons 5 when the LED illuminates the photocathode. The electron beam lenses 4 shape the emitted electrons into a suitable beam, by collecting the emitted photocathode electrons. The beam may have a diameter in the region of 1 mm to 3 mm. The electron beam lenses 4 may be electrostatic components or of combined magnetic-electrostatic type. Typically, when the beam generation module is operating efficiently, the electron beam may provide a current of above 1 nA.

The LED may emit ultraviolet (UV) light having a wavelength approximately equal to or less than 300 nm. The photocathode may be made from magnesium, aluminium, manganese, silver or other suitable materials with the work function around or above 4 eV. It will be apparent to the person skilled in the art that a number of combinations of LED and photocathode material may be used to generate a suitable electron beam, where for any such combination, the energy of the LED light should be above the work function of the photocathode.

To facilitate the generation of the electron beam, the photocathode is maintained at a negative potential, approximately up to 15 keV, in relation to the chamber walls and the material of interest. This voltage is provided by the power supply 110. The power supply allows the voltage to be adjusted. Preferably, the power supply is compact in size, mobile and derives its energy from a rechargeable source. A suitable power supply may be the Ultravolt Model 25C24-N60 for example.

The chamber 1 of the handheld material analyser 100 further comprises an outlet connected to a vacuum system 108. The vacuum system comprises a vacuum pump (not shown) suitable for generating a pressure of 1 Pa or below and a mobile vacuum indication and monitoring unit, which may comprise a vacuum gauge. Preferably, the vacuum pump is sufficiently small in size to be easily transportable. Typically, the vacuum pump is a pump as may be described as a fore-vacuum pump, coarse vacuum pump or roughing pump. During electron beam operation, the chamber vacuum should be of a sufficient level to prevent plasma discharge.

The electron beam is directed out of an aperture in the chamber 1. The aperture is located opposite the photocathode 2. The aperture is adapted to pass the electron beam to the material. The edge of the aperture is surrounded by a seal that allows an air-tight contact to be made against the surface of the material sample to be analysed. The seal allows the creation and maintenance of a vacuum in the chamber of the analyser during analysis.

When the handheld material analyser 100 is in place on a sample material to be analysed, the electron beam impinges on the material, resulting in the emission of atomically specific X-rays 11 from the sample. These X-rays 11 travel back through the aperture into the chamber 1. The X-rays 11 excited by electrons 5 of the electron beam are characteristic of the material on which the electron impacts. Therefore, by analysing the X-ray energy spectra 11 emitted in response to the electron beam, it is possible to obtain information on the elements comprised in the sample material.

The chamber 1 further comprises an inert gas inlet 112 through which an inert gas, such as argon, may be admitted into the chamber.

The handheld material analyser 100 further comprises an Energy-dispersive X-ray spectroscopy (EDX) system, having a detector 7 in the chamber 1. The EDX detector 7 is located adjacent the aperture. Preferably, the EDX detector 7 is located at a distance that provides for efficient capture of the emitted x-rays 11. In an example, the detector 7 is located within tens of millimetres of the aperture. The EDX detector may be fitted with a magnetic electron trap and ultrathin polymeric window with collimator system. The collimator system reduces background x-ray collection. Optionally, the inside of the chamber adjacent to the aperture may be formed of or coated with a material of a low atomic number lower than or equal to that of Magnesium so as to reduce the background X-ray level. For example, the coating may be of boron. The detector 7 may in comprise one or more individual detectors (not shown). Additionally or alternatively, the detector 7 may comprise a detector array (not shown).

The handheld material analyser 100 further comprises a control module 114. The control module 114 controls the operation of the device to allow it to function as required. The control module may also receive data from the EDX spectrometer and provide signal acquisition and analysis. In a preferred embodiment, the x-ray spectra will be wirelessly transferred to computing device such as a laptop, tablet or handheld device which will identify the atomic species by known "X-ray fingerprints" from the spectra and quantify the results, using dedicated software.

The focussed LED and photocathode are chosen and arranged to ensure a beam of electrons is generated providing sufficient current to generate, on impact with the material to be analysed, a sufficient level of x-rays in a reasonable time period. Preferably, a sufficient number of characteristic X-rays would be accumulated in approximately 1 minute or faster. Experimentally, it has been shown that a current of 1 nA or greater typically results in the accumulation of sufficient numbers of counted X-rays Oxidation may occur on the photocathode 2 as a result of exposure of the photocathode to air and due to operating the photocathode at the operational pressures of the handheld material analyser 100. Oxidation of the photocathode can reduce the number of photoelectrons emitted in response to illumination by the focussed LED 3. In this way, oxidation of the photocathode may result in insufficient current to generate sufficient flux of X-rays for analysis.

Figure 3:
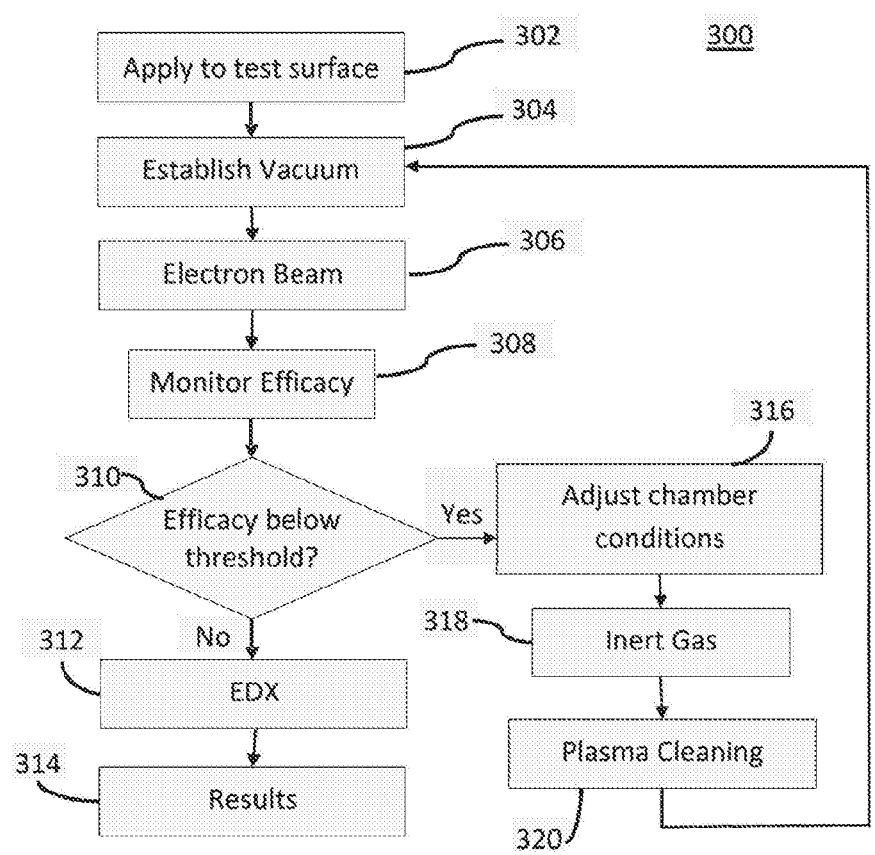
FIG. 3 is a flowchart of a method of operating the material analyser.

Referring now to FIG. 3, a method 300 of operation of the handheld material analyser 100 is described. Firstly, a sample surface of the material to be analysed is cleaned of debris and oxides in preparation for analysis. In step 302, the handheld material analyser 100 is placed in contact with the surface of the sample 102, such that an air-tight contact is formed between the seal surrounding the aperture and the surface. In step 304, the vacuum system 108 is operated to establish a low-pressure environment, with a pressure of the order of 1 Pa, within the chamber. A vacuum below 1 Pa may be established. Typically, a suitable vacuum of around 1 Pa will be established in approximately 60 seconds. Next, in step 306, the electron beam generation system 104 is operated so that a beam of electrons is directed at the surface of the material through the aperture. These photoelectrons impacting on the material of interest generate X-rays. In step 308, the efficacy of the electron beam generation system 104 is monitored. This may be done in a number of ways, including monitoring the current drawn from the power supply, or by measuring the count rate for X-rays detected by the EDX detector 7, where the count rate is the number of X-rays detected per second. In step 310, the efficacy of the electron beam generation system 104 is compared to a threshold. If the drawn current is being monitored, the threshold may be 1 nA, while for the X-ray count rate the threshold may be 10,000 x-rays per second. If the efficacy is above the threshold, the method proceeds to step 312, where EDX analysis is carried out on the emitted X-ray spectra as accumulated by the EDX detector. The emitted X-rays represent a "fingerprint" of atomic species presented in the material of interest. The detector 7 detects the X-rays emitted by the material and their energy is analysed by an Energy Dispersive Energy X-ray analyser 7. In this way, the X-Ray spectra of the emitted X-ray 11 allow the elements in the material and their concentration to be obtained. The analysis may take a few seconds to a few minutes, depending on the quantification accuracy desired. The finals results are provided, via the control module 114 in step 314.

If the efficacy is below the threshold in step 310, the method proceeds to initiate a photocathode cleaning operation. The cleaning process comprises, in step 316, adjusting the chamber conditions, which may include powering off the LED and detector and lowering the voltage on the photocathode to approximately to 2 kV. Then, in step 318, an inert gas such as argon is admitted into the chamber such that a plasma is formed near the photocathode. The plasma initiation and conditions may be monitored by the high voltage power supply current. The inert gas may be admitted by way of a calibrated leak. Such a calibrated leak, which may comprise a washer having a calibrated hole, is a small and simple way of controlling the admission of the gas the chamber. Typically, sufficient argon is admitted to provide a pressure of the order of 10 Pa in the chamber. The pressure in the chamber is dynamic and is a balance between inert gas leaking in and vacuum pumping. Ion bombardment of the photocathode by the plasma cleans the photocathode surface, removing any oxidation that has built up on the surface of the photocathode. This cleaning process may also be referred to as sputter cleaning. The cleaning process typically takes less than 1 minute. Once the cleaning is finished, the inert gas leak is closed, the required vacuum is re-established and the devices are powered up and the analysis operation is completed. The photocathode cleaned of oxidation will once more provide enough electrons to generate a sufficient level of characteristic X-rays from the material under analysis. If, after the cleaning process is complete, the electron beam generation system is still not operating above the efficacy threshold, a further cleaning operation may be implemented. Alternatively, if one or two cleaning operations have not worked to improve electron generation sufficiently, then further analysis of the device may be required to diagnose the problem and provide necessary repairs.

Figure 4:
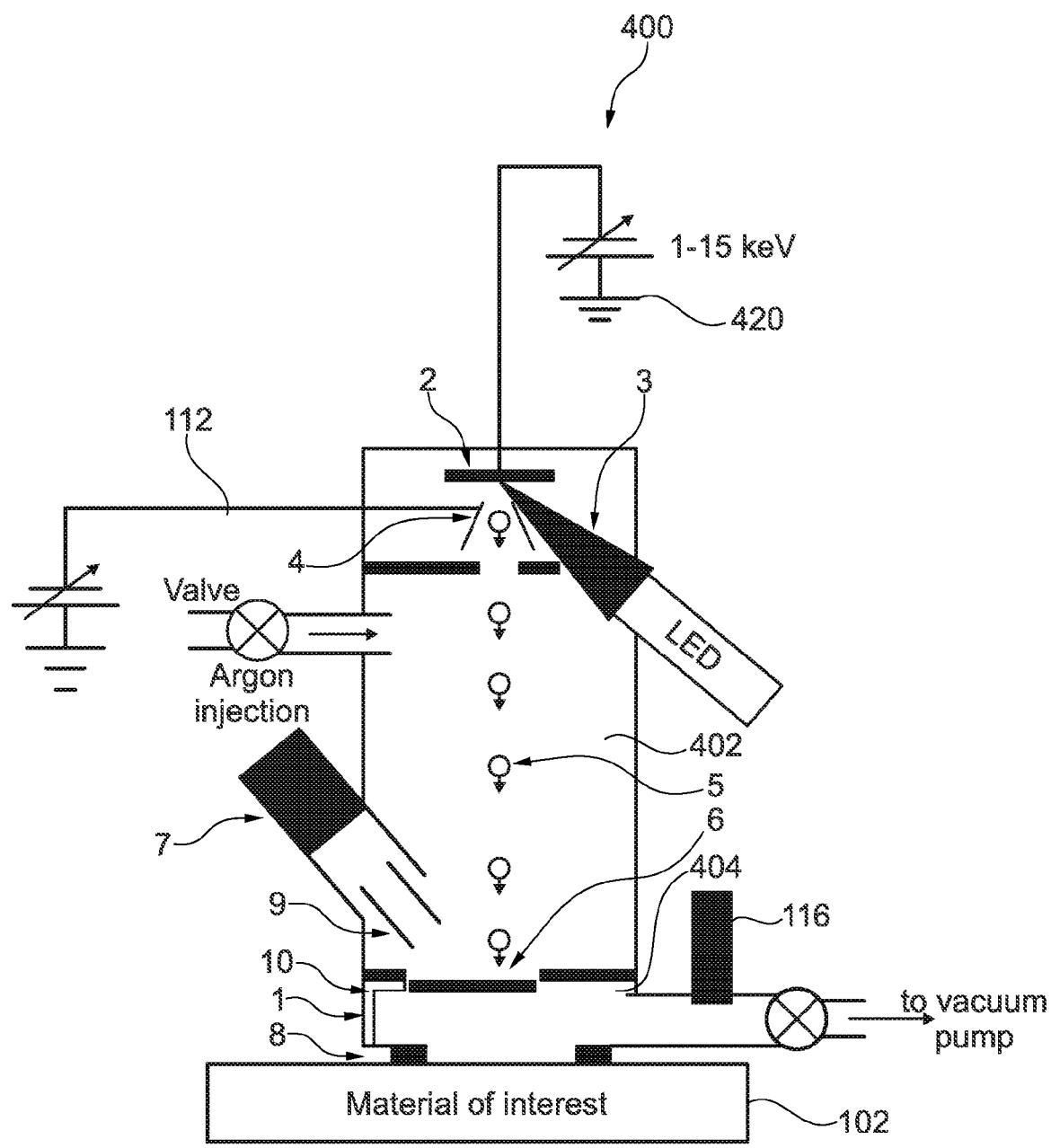
FIG. 4 is a diagram of an alternative material analyser, having a separation valve.

Referring now to FIG. 4, there is shown an alternative embodiment of handheld material analyser, indicated generally by the reference numeral 400. The handheld material analyser 400 of FIG. 4 is similar to that of FIG. 2, however the handheld material analyser 400 comprises an air-tight separation valve 6 that divides the chamber 1 into a beam generation chamber 402 and a sample chamber 404. The beam generation chamber 402 comprises the photocathode 2, focussed LED 3, electron beam lenses 4, EDX detector 7 and gas inlet 112. The sample chamber 404 comprises the aperture and outlet to the vacuum system 108. The sample chamber 404 comprises a coating 10 of a material of low atomic number Z, such as boron, to reduce X-ray background in the sample chamber 404 and so improve the X-ray detection limit by the EDX detector 7. The EDX detector 7 is shown fitted with a collimator and electron trap 9 to reduce capture of background X-rays 11 by the detector 7. FIG. 4 further shows a variable high voltage power supply 420 connected to the photocathode 2 and further power supply 422 connected to the electron beam lenses 4.

Figure 5:
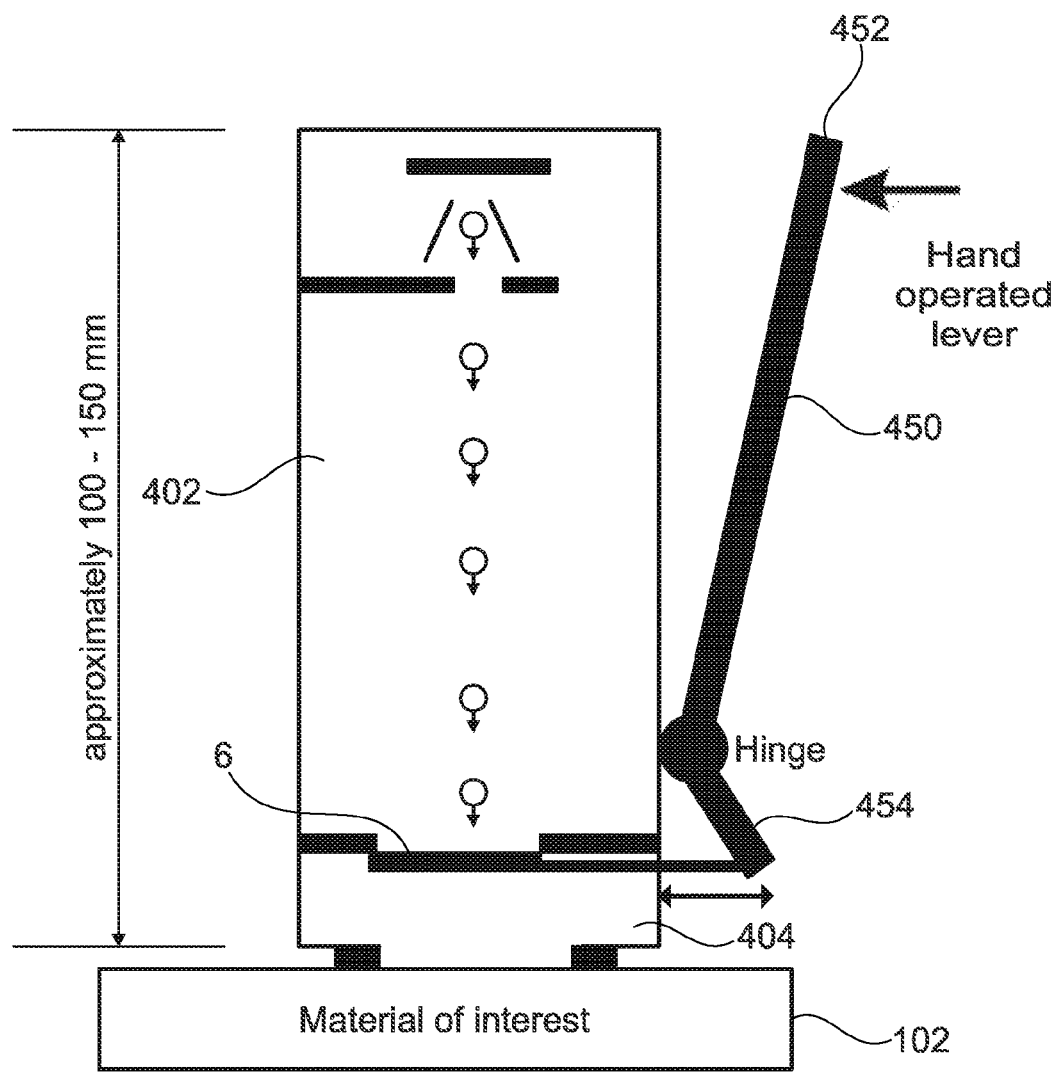
FIG. 5 is a diagram of the material analyser of FIG. 5.

In FIG. 5, an example mechanism for operating the separation valve 6 is shown. The mechanism comprises a hinged lever 450, having a handle end 452 and a valve end 454, affixed to the outside of the handheld material analyser 400. When the handle end 452 is moved towards the walls of the analyser 400, the valve end 454 moves so as to open the separation valve and so provide a path for electrons from the beam generation chamber 402 through the sample chamber 404 to the aperture. It will be apparent to the person skilled in the art that such a valve mechanism is one of many suitable mechanisms, manual and/or automated, to allow the separation valve 6 to be controlled in use. By providing for closing off the beam generation chamber in this way, it is possible to reduce the exposure of the photocathode to air and so reduce the oxidisation of the photocathode. This will provide a longer time between photocathode cleaning operations.

Figure 6:
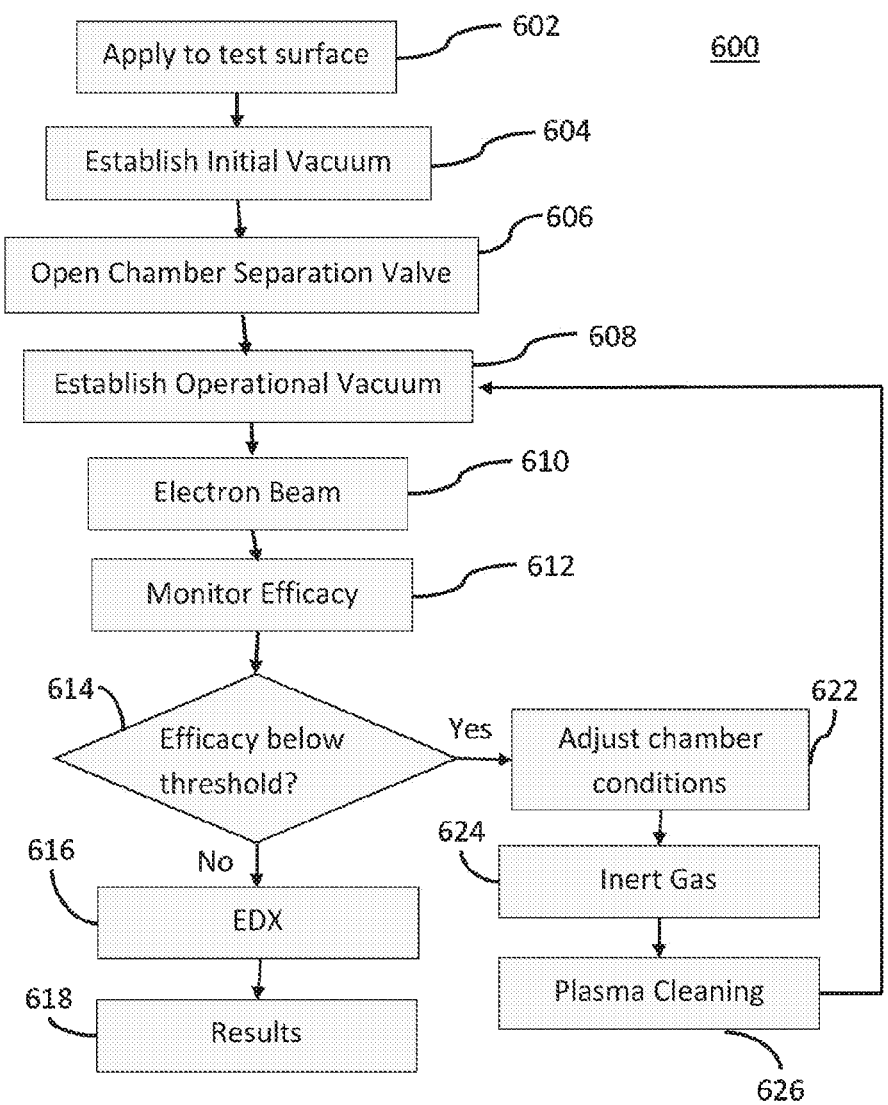
FIG. 6 is a flowchart of an alternative method of operating the material analyser.

Referring now to FIG. 6, there is shown a flowchart of a method 600 of operation of the handheld material analyser 400. In step 602, the handheld material analyser 400 is placed in contact with the surface of the sample 102, with the separation valve 6 in the closed position. An air-tight contact is formed between the seal surrounding the aperture and the surface. In step 604, the vacuum system 108 is operated to establish an initial vacuum environment in the sample chamber 404, with a pressure of the order of 10 Pa. Typically, a suitable vacuum will be established in approximately 60 seconds. In step 606, the separation valve 6 is opened such that the chambers are no longer separated. Next, in step 608, an operational vacuum environment in implemented in the combined chambers by bringing the pressure down to the order of 1 Pa or below therein. In step 610, the electron beam generation system 104 is operated by powering the focussed LED 3, photocathode 2 and beam lenses 4 so that a beam of electrons 5 is directed at the surface of the material 102 through the aperture. These photoelectrons impacting on the material of interest generate X-rays. In step 612, the efficacy of the electron beam generation system 104 is monitored. This may be done in a number of ways, including monitoring the current drawn from the high voltage power supply, or by measuring the count rate for x-rays detected by the EDX detector 7, where the count rate is the number of X-rays detected per second. In step 614, the efficacy of the electron beam generation system 104 is compared to a threshold. If the drawn current is being monitored, the threshold may be 1 nA, while for the X-ray count rate the threshold may be 10,000 X-rays per second. If the efficacy is above the threshold, the method proceeds to step 614, where EDX analysis is carried out on the emitted x-rays as accumulated by the EDX detector. The emitted X-rays represent a "fingerprint" of atomic species presented in the material of interest. The detector 7 detects the X-rays emitted by the material and their energy is analysed by an Energy Dispersive Energy X-ray analyser 7. In this way, the X-ray energy spectra of the emitted X-ray 11 allow the elements in the material and their concentration to be obtained. The analysis may take a few seconds to a few minutes, depending on the quantification accuracy desired. The finals results are provided, via the control module 114 in step 616. The separation valve is closed before the device is removed from the material under analysis. In this way, exposure of the photocathode to air is reduced.

If the efficacy is below threshold in step 614, the method proceeds to initiate a photocathode cleaning operation. The cleaning operation comprises, in step 622, adjusting the chamber conditions, which may include powering off the focussed LED and EDX detector and lowering the voltage on the photocathode to approximately to 2 kV. Then, in step 624, an inert gas such as argon is admitted into the chamber such that a plasma is formed near the photocathode. The inert gas may be admitted by way of a calibrated leak. Such a calibrated leak, which may comprise a washer having a calibrated hole, is a small and simple way of controlling the admission of the gas the chamber. Typically, sufficient argon is admitted to provide a dynamic pressure of the order of 10 Pa in the chamber. Ion bombardment of the photocathode by the plasma cleans the photocathode surface, removing any oxidation that has built up on the surface of the photocathode. This cleaning process may also be referred to as sputter cleaning. The cleaning process can be monitored by the high voltage current. The cleaning process typically takes less than 1 minute. Once the cleaning is finished, the method reverts to step 606, closing the chamber separation valve and continuing the remaining steps. The photocathode cleaned of oxidation will once more provide enough electrons to generate a sufficient level of characteristic X-rays from the material under analysis. If, after the cleaning process is complete, the electron beam generation system is still not operating above the efficacy threshold, a further cleaning operation may be implemented. Alternatively, if one or two cleaning operations have not worked, then further analysis of the device may be required to diagnose the problem.

It will be understood that the focussed LED and/or the detector 7 may be shut down before the plasma conditions are established It will be understood that plasma may be induced in a number of ways and the disclosure is not limited to those methods described in detail herein. For example, the focussed LED may remain powered on so as to assist in the generation of the plasma.

Maintaining the beam generation chamber 402 at the initial low pressure of 10 PA by closing the separation valve has a number of advantages. Firstly, it is faster to establish the operational vacuum environment for each test, allowing quick operation of the device. Secondly, oxidation of the photocathode is reduced, such that less frequent cleaning is required.

The material analyser has been described primarily in relation to use in identifying metals and alloys in an industrial setting, however it will be understood that the underlying principles apply to all materials. In this way, the material analyser may be used on any material, as desired.

Photocathode materials are not limited to elemental targets but can be metal alloys with the suitable work function.

The material analyser described herein has been described as mobile. The chamber portion of the material analyser may be small enough to be handheld, with the remaining parts of the system, e.g. power supplies, being sufficiently small to be mobile, that is, easily transportable.

Throughout the description and claims of this specification, the words "comprise" and "contain" and variations of them mean "including but not limited to", and they are not intended to (and do not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A handheld material analyser comprising
an air-tight chamber having an analysis aperture, the analysis aperture being surrounded by a seal suitable for forming a temporary air-tight seal against a material surface to be analysed;
an electron beam generation system comprising a focussed LED adapted to illuminate a photocathode, wherein the photocathode is located in the air-tight chamber and the electron beam generation system is adapted to direct a beam of electrons through the analysis aperture;
an Energy-Dispersive X-ray (EDX) spectroscopy system having a detector located in the air-tight chamber;
the air-tight chamber being adapted to operate at internal pressures between atmospheric pressure and a vacuum of the order of or below 1 Pa, and having an outlet adapted to be connected to a vacuum pump; and a gas inlet adapted to receive an inert gas for generating a plasma in the region of the photocathode, such that the plasma cleans the photocathode.

2. A handheld material analyser as claimed in claim 1 wherein the air-tight chamber comprises a beam generation chamber separated from a sample chamber by a normally closed air-tight separation valve, which in an open position provides a path for the beam of electrons to reach the analysis aperture.

3. A handheld material analyser as claimed claim 2 wherein the outlet is located in the sample chamber.

4. A handheld material analyser as claimed in claim 3 wherein the detector is located in the beam generation chamber.

5. A handheld material analyser as claimed in claim 2 wherein the gas inlet is located in the beam generation chamber.

6. A handheld material analyser as claimed in claim 1 wherein the outlet is connected to a single stage vacuum pump.

7. A handheld material analyser as claimed in claim 1 wherein the outlet is connected to a mobile vacuum indication and monitoring unit.

8. A handheld material analyser as claimed in claim 1 wherein the gas inlet is connected to a gas supply system.

9. A handheld material analyser as claimed in claim 1 further comprising a calibrated leak washer for admitting gas to the air-tight chamber through the gas inlet.

10. A handheld material analyser as claimed in claim 1 wherein the photocathode is aluminium.

11. A handheld material analyser as claimed in claim 1 wherein the focussed LED has a wavelength of approximately equal to or less than 300 nm.

12. A handheld material analyser as claimed in claim 1 further comprising a controller adapted to assess an efficacy of the electron beam generation system and trigger cleaning of the photocathode if the efficacy drops below a threshold.

13. A handheld material analyser as claimed claim 12 further comprising a high voltage power supply connected to the photocathode and the efficacy of the electron beam generation system is assessed by monitoring current drained therefrom.

14. A handheld material analyser as claimed in claim 13 wherein the high voltage power supply is adapted to provide a voltage to the photocathode of below or equal to 15 kV during electron beam generation and below or equal to 2 kV during cleaning.

15. A handheld material analyser as claimed in claim 1 wherein the EDX spectroscopy system further comprises a spectrometer for counting X-rays detected by the detector and an efficacy of the electron beam generation system is assessed by monitoring a number of detected x-rays per unit time.

16. A handheld material analyser as claimed in claim 1 wherein the air-tight chamber is adapted to operate at an internal pressure below 1 Pa.

17. A handheld material analyser as claimed in claim 1 wherein the photocathode is a metal or metal alloy with a suitable work function.

18. A method for analysing a material sample using a handheld material analyser, the handheld material analyser having a chamber with an analysis aperture, the steps of the method comprising applying the analysis aperture to a surface of a material to be analysed such that an air-tight seal is formed;

establishing a pressure of the order of or below 1 Pa within the chamber;

generating a beam of electrons in the chamber, by illuminating a photocathode within the chamber with a focussed LED, directing the beam of electrons at the surface through the analysis aperture;

analysing X-ray emissions from the surface resulting from the impact of the beam of electrons to determine the elemental composition of the material sample;

the method further comprising assessing an efficacy of the step of generating a beam of electrons, and if the efficacy is below a threshold, initiating a cleaning cycle, wherein the cleaning cycle comprises adjusting the potential between the chamber and photocathode;

providing an inert gas to the chamber through a gas inlet to generate a pressure in the order of 10 Pa such that a plasma is formed in the region of the photocathode.

19. A method as claimed in claim 18 wherein the step of assessing the efficacy comprises measuring a current drain from a high voltage power supply powering the photocathode.

20. A method as claimed in claim 18 wherein the step of assessing the efficacy comprises counting characteristic X-rays emitted by the material sample in response to the beam of electrons.

21. A method as claimed in claim 18 wherein the step of adjusting the potential between the chamber and the photocathode comprises setting the potential at around 2 kV.

22. A method as claimed in claim 18 wherein the cleaning cycle further comprises deactivating the focussed LED.

23. A method as claimed in claim 18 wherein the chamber comprises a beam generation chamber separated from a sample chamber by a normally closed air-tight separation valve, which in an open position provides a path for the beam of electrons to reach the analysis aperture, wherein the sample chamber comprises an outlet which is connected to a vacuum pump and the method comprises the further steps of, after applying the analysis aperture to the surface, establishing a pressure in the order of 10 Pa within the sample chamber, then opening the separation valve, and establishing a pressure of the order of or below 1 Pa within the chamber.

* * * * *